(12) United States Patent
Hsu et al.

(10) Patent No.: US 6,462,595 B1
(45) Date of Patent: Oct. 8, 2002

(54) CMOS LOW-VOLTAGE DYNAMIC BACK-GATE FORWARD BIAS PRESCALER

(75) Inventors: June-Ming Hsu, Taipei (TW); Shen Juan Liu, Taipei (TW)

(73) Assignee: National Science Council, Taipei (*) Notice: Subject to any disclaimer, the term of this patent is extended or adjusted under 35 U.S.C. 154(b) by 0 days.

(21) Appl. No.: 09/626,395

(22) Filed: Jul. 26, 2000

(30) Foreign Application Priority Data

Oct. 7, 1999 (TW) .......................................... 088117342

(51) Int. Cl.[7] .............................................. H03K 25/00
(52) U.S. Cl. ...................................... 327/215; 327/217
(58) Field of Search ................................ 327/115, 117, 327/215, 218

(56) References Cited

U.S. PATENT DOCUMENTS

| | | | | |
|---|---|---|---|---|
| 5,644,266 A | * | 7/1997 | Chen et al. ................... | 327/534 |
| 5,930,322 A | * | 7/1999 | Yang et al. ................... | 327/115 |
| 5,969,548 A | * | 10/1999 | Knapp ......................... | 327/115 |
| 6,067,739 A | * | 5/2000 | Knapp et al. ................. | 327/115 |
| 6,131,181 A | * | 12/2000 | Nishiyama ................... | 327/115 |

OTHER PUBLICATIONS

Senneff et al., "A sub–1 ma 1.5–Ghz Silicon Bipolar Dual Modulus Prescaler" 10/94, IEEE Journal of Solid–State Circuits, pp. 1206–1211.*
Mizuno et al. "A 3–mW 1.0–GHz Silicon–ECL Dual–Modulus Prescaler IC" 12/92, IEEE Journal of Solid State Circuits, vol., No. 12, pp. 1794–1798.*
Nippon Precision Circuits Inc. data sheet, SM5160CM/DM, pp. 1–7, 1995.
Chen et al, IEEE Trans on Electron Devices, vol. 43, No. 6, "Back–Gate Forward Bias . . . ", pp. 904–910, Jun. 1996.
Wong et al, IEEE International Solid–State Circuits Conf., "A 1V CMOS Digital Circuits . . . ", pp. 292–293, 473, 1997.
Lindert et al, IEEE JOUR of Solid–State Circuits, vol. 34, No. 1 "Dynamic Threshold Pass–Transistor . . . ", pp. 85–89, Jan. 1999.
Yuan et al, IEEE JOUR of Solid–State Circuits, vol. 24, No. 1, "High–Speed CMOS Circuit Technique", pp. 62–70, Feb. 1989.
Chang et al, IEEE JOUR of Solid–State Circuits, vol. 31, No. 5, "A 1.2 Ghz CMOS Dual–Modulus . . . ", pp. 749–752, May 1996.
Yang et al, IEEE JOUR of Solid–State Circuits, vol. 33, No. 10, "New Dynamic Flip–Flops for . . . ", pp. 1568–1571, Oct. 1998.
Karanicolas, IEEE JOUR of Solid–State Circuits, vol. 31, No. 12, "A 2.7–V 900–MHZ CMOS LNA . . . ", pp. 1939–1944, Dec. 1996.
Kim et al, IEEE JOUR of Solid–State Circuits, vol. 32, No. 5, "A 960–Mb/s/pin Interface for . . . ", pp. 691–700, May 1997.

* cited by examiner

*Primary Examiner*—Terry D. Cunningham
(74) *Attorney, Agent, or Firm*—Jacobson Holman, PLLC

(57) ABSTRACT

A low-voltage divide-by-64/65 prescaler fabricated with a 0.35 μm standard CMOS technology is presented to lower power dissipation. A new dynamic D-flip-flop (DFF) using the dynamic back-gate forward bias method has been developed for low-voltage operation. The prescaler including a preamplifier measured at 1 V supply voltage has a maximum operating frequency of 170 MHz and its power dissipation is only 0.9 mW.

5 Claims, 19 Drawing Sheets

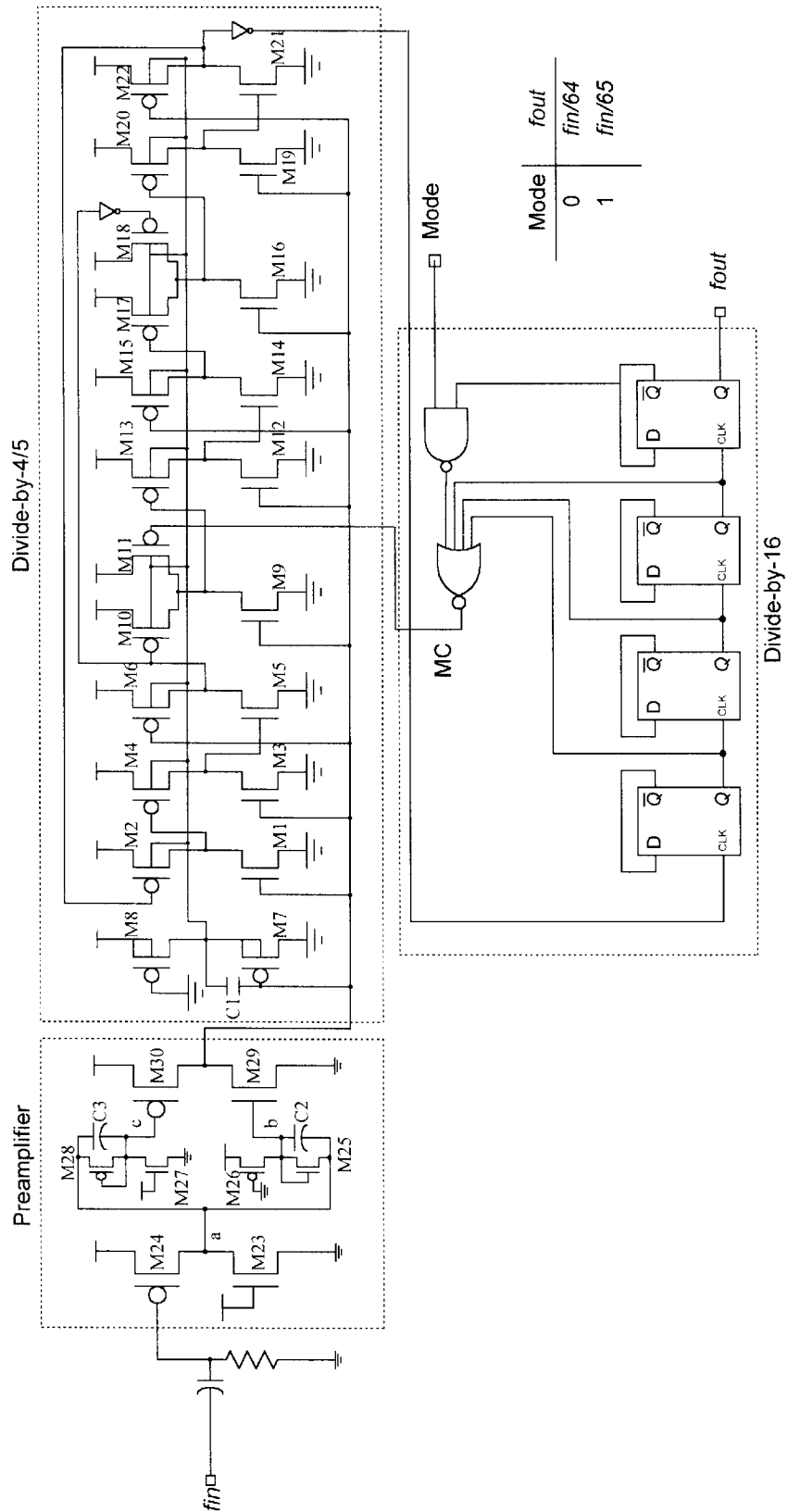
Fig. 11 Schematic of the whole chip.

CMOS LOW-VOLTAGE DYNAMIC BACK-GATE FORWARD BIAS PRESCALER

FIELD OF THE INVENTION

In modern communications, the phase-locked loop (PLL) based frequency synthesizer is an important building block for frequency translation. The high-speed prescaler and the voltage-controlled oscillator (VCO) are the most critical components in a frequency synthesizer. Although they are usually implemented in bipolar or GaAs technologies before, advanced standard CMOS technology has been widely used to design such circuits for the several years in order to realize the single-chip RF-to-baseband systems.

BACKGROUND OF THE INVENTION

The prescaler is a high-speed digital frequency divider, and one of the important design goals of the circuit is low power consumption for the battery-operated portable applications. For CMOS digital circuits, the dynamic dissipation power is proportional to the square of supply voltage and thus the goal can be efficiently achieved by lowering the supply voltage. For example, Nippon Precision Circuits Inc. datasheet, "SM5160CM/DM" disclosed a 1 V frequency synthesizer implemented in special CMOS process has been used for pager systems.

DESCRIPTION OF THE PRIOR ART

However, further reduction in threshold voltage is not easy because of the exponentially increasing subthreshold current. For example, the typical threshold voltages of the NMOS and PMOS transistors in the technology we use are 0.55 V and 0.7 V respectively. Thus, the operating speed of low-voltage digital circuits will be limited.

Recently, Ming -Jer Chen et al. disclosed a novel back-gate forward bias (BGFB) scheme which has been introduced as an efficient trade-off between operating speed and subthreshold leakage current [IEEE Transactions on electron devices, vol. 43, no. 6, pp. 904–909, Jun. 1996]. This circuit technique can be used in present standard bulk CMOS processes to reduce the threshold voltage electrically without any mask or process modifications.

In this invention, a new low-voltage inverter and DFFs using the "dynamic" BGFB method are presented. A 1 V dual-modulus prescaler using the proposed DFFs has been fabricated in a standard 0.35 µm CMOS technology. The maximum operating frequency of 170 MHz has been measured at 1 V supply voltage.

SUMMARY OF THE INVENTION

In this invention a low-voltage divide-by-64/65 prescaler fabricated with a 0.35–µm standard CMOS technology is presented to lower power dissipation. A new dynamic D-flip-flop (DFF) using the dynamic back-gate forward bias method has been developed for low-voltage operation. The prescaler including a preamplifier measured at 1 V supply voltage has a maximum operating frequency of 170 MHz and its power dissipation is only 0.9mW.

BRIEF DESCRIPTION OF THE DRAWINGS

Table I Some features of the prescaler proposed.

FIG. 1 (a) Schematic.

FIG. 1 (b) Transient response

FIG. 1 (c) Propagation delay.

FIG. 3 (b) Diagram that describes the function of the DFF in "hold" mode

FIG. 3 (c) Diagram that describes the function of the DFF in "evaluation" mode when "D" is 1.

FIG. 3 (d) Diagram that describes the function of the DFF in "evaluation" mode when "D" is 0.

FIG. 3 (e) Circuit schematic of the proposed dynamic BGFB AND LFF.

FIG. 5 (b) Proposed low-voltage preamplifier.

FIG. 6 (b) Improving Factor.

FIG. 11 . Schematic of the whole chip

DETAILED DESCRIPTION OF THE INVENTION

New Dynamic Back-gate forward bias inverter Ming-Jer Chen et al. described some experimental results about the BGFB method have been presented in [IEEE transactions on electron devices, vol. 43, no. 6, pp. 904–909, Jun. 1996]. A few important conclusions are briefly introduced below. In circuit designs, we often short the source and the body of MOS transistors or reversely bias it. However, if we forwardly bias it by adding a small voltage on the body with respect to the source, there is a small increase in the drain current and the current increase is magnified with reducing the gate voltage. This result can be viewed as a reduction in threshold voltage. In other words, the rising time and the falling time of an inverter can be reduced with the BGFB method, and thus the operating speed of digital circuits can be increased, especially at low supply voltage. However, the small forward bias voltage should not be larger than 0.4 V in order to prevent it from latch-up.

Figure 1A:
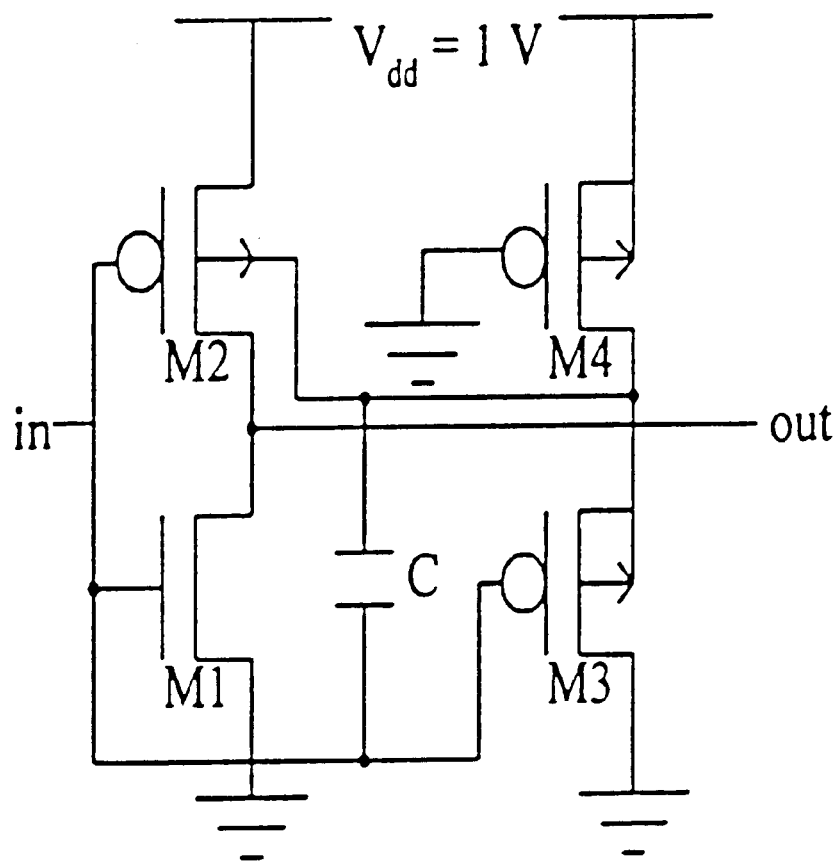
FIG. 1 Improved inverter using the dynamic BGFB method.
Figure 1B:
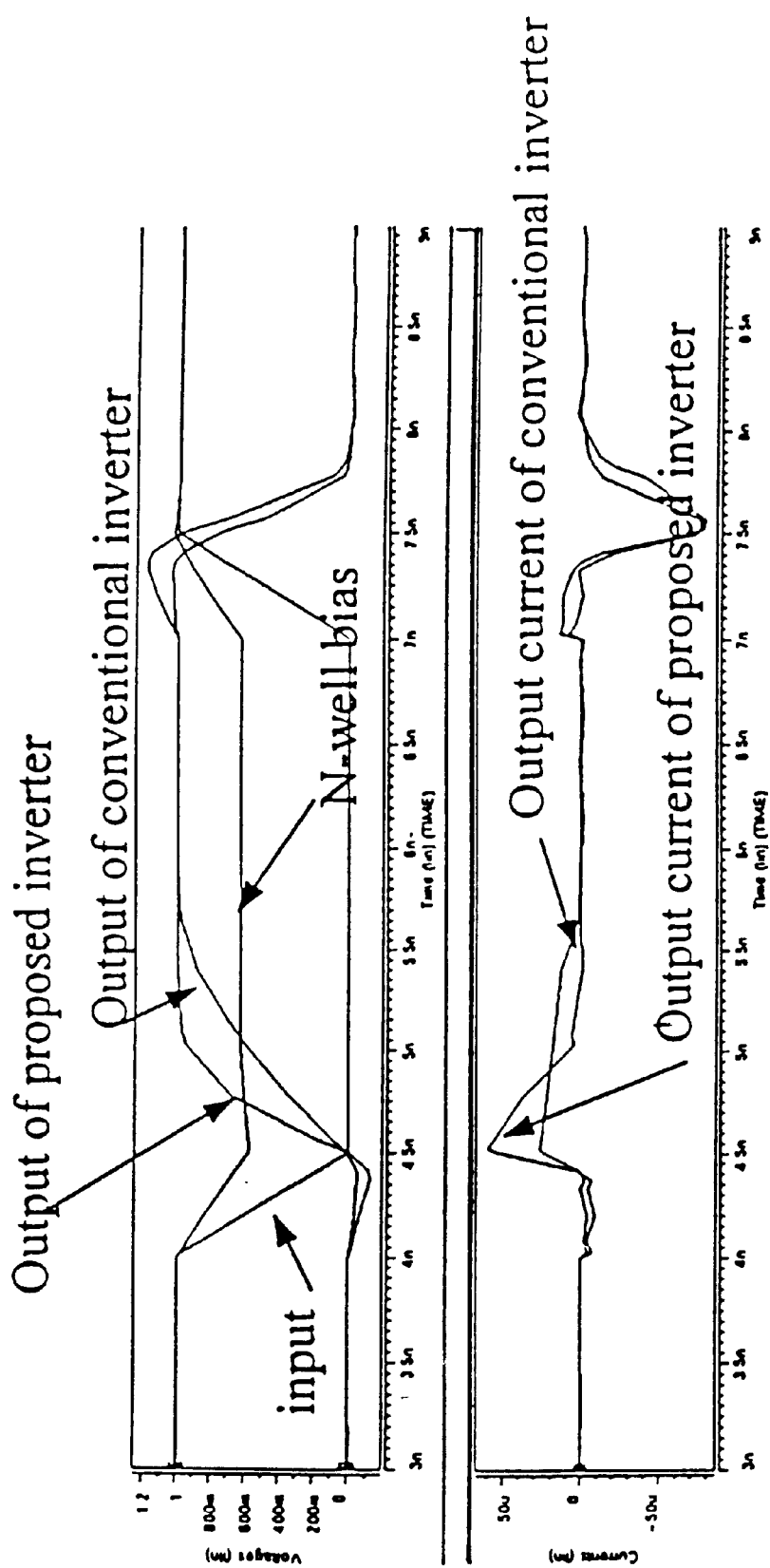
Figure 1C:
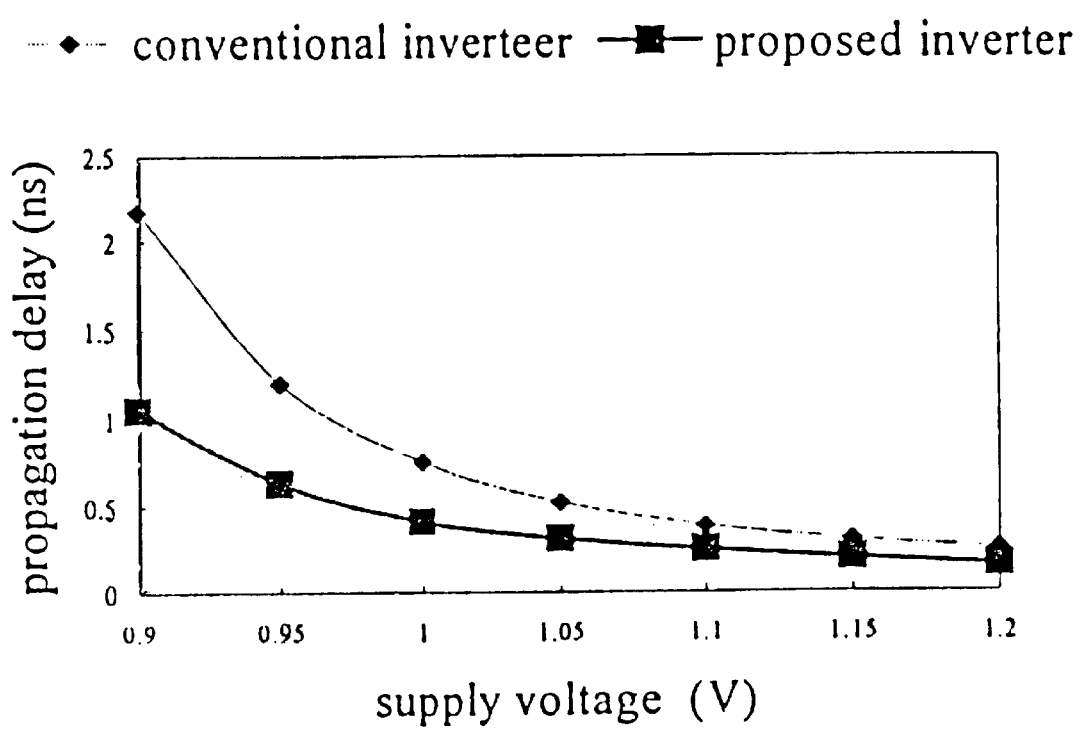

Since the bottleneck of the operating speed of low-voltage digital circuits depends on the PMOS transistors, whose mobility is only about half of the NMOS ones, it is more efficiently to apply the BGFB method on PMOS transistors only. FIG. 1(a) is the proposed 1 V dynamic BGFB inverter. M1 and M2 form a conventional CMOS inverter, and M3 and M4 form a source follower to dynamically bias the substrate of M2 (N-type well). As shown in FIG. 1(b), when the input of the inverter goes low, M3 and M4 turn on then the substrate of M2 will follow the input and become lower. M3 is designed to have a small $V_{sg}$ of 0.6~0.7 V, thus $V_{sb}$ of M2 is about 0.3~0.4 V, which can electrically reduce the threshold voltage of M2. In this instance, the PMOS transistor, M2, can deliver a larger drain current to the output capacitor than a conventional inverter does, and reduce the propagation delay of the gate. When the input starts to go high, M3 turns off then the substrate of M2 is pulled back to $V_{dd}$ by M4. The threshold voltage of M2 returns to the normal value again. Therefore, with the dynamic BGFB method, M2 is able to pull up faster and turn off normally without excess leakage current. The small capacitor, C (about 250 fF), is used to improve the switching speed of the PMOS substrate. From another point of view, the small capacitor and M4 can be regarded as a highpass filter, which directly couple the input signal to the substrate of M2. M4 is used to keep the substrate bias voltage above 0.6 V, and thus latch-up can be avoided. The difference between the propagation delays of a conventional CMOS inverter and the dynamic BGFB inverter is also compared in FIG. 1(c). By the way, the bias scheme presented here can also be applied to the dynamic logic circuits such as D-flip-flops (DFF), which will be discussed in the next section.

Circuit description

Figure 2:
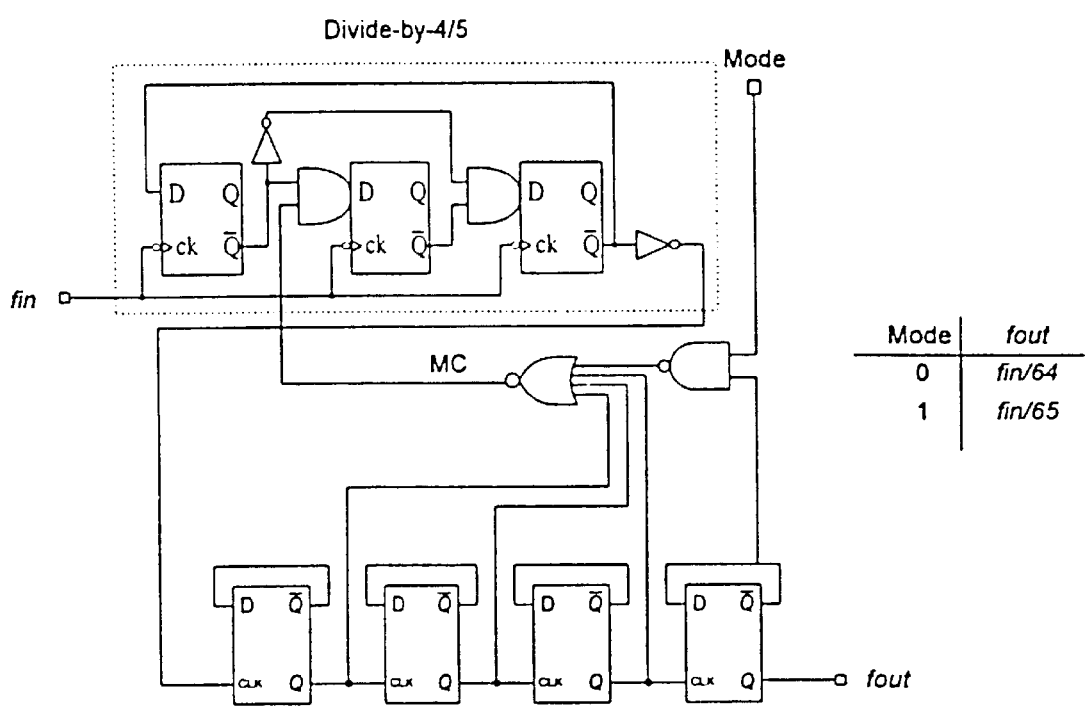
FIG. 2 Functional block diagram of the dual-modulus prescaler.

FIG. 2 shows the schematic of the low-voltage dynamic back-gate forward bias prescaler. The dual-modulus divide-by-64/65 prescaler consists of a synchronous divide-by-4/5 counter, an asynchronous divide-by- 16 counter and a few static gates. When mode is one (zero), the divide ratio is 65 (64). A new dynamic DFF using the dynamic BGFB method is developed here for low-voltage operation.

A. Low-voltage dynamic back-gate forward bias DFF

The true single-phase clock (TSPC) DFFs proposed by Jiren Yuan and Christer Svensson have been widely used in many digital circuit designs [IEEE J. Solid-State Circuits, vol. 24, no. 1, pp. 62–69, Feb. 1989]. This is because of its features of high operating speed and simple circuits required. Ching-Yuan Yang et al. and many works have been done to improve the performances of TSPC DFFs [IEEE J. Solid-State Circuits, vol. 33, no. 10, pp. 1568–1571, Oct. 1998]. Among them, Byungsoo Chang et al. described a 7-transistors ratioed version which has been proposed in [IEEE J. Solid-State Circuits, vol. 31, no. 5, pp. 749–752, May 1996]. It replaces the N-precharge stage and the N-C²MOS stage in a negative-triggered TSPC DFF by two pseudo-nMOS inverters to form a ratioed latch. Instead of the stacked structures in TSPC circuits, no serial transistors are used in the latch, thus the RC time constant can be reduced. Therefore, this DFF with a ratioed latch has better frequency response then the conventional TSPC DFFs and it is more suitable for low-voltage operation.

Figure 3A:
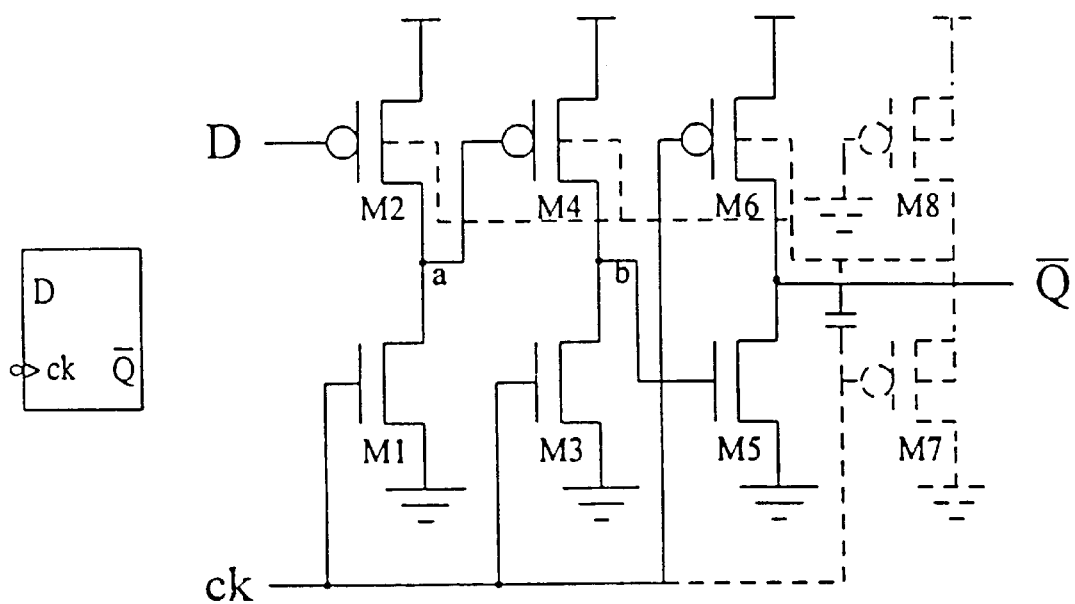
FIG. 3 (a) Circuit schematic of the proposed dynamic BGFB DFF
Figure 3B:
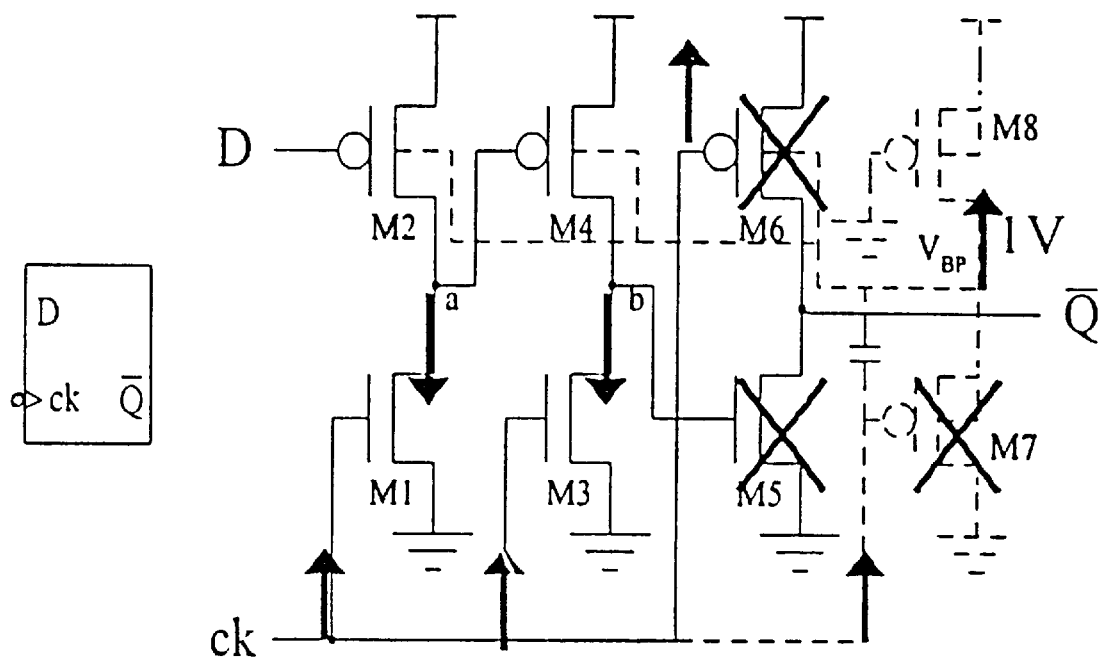
Figure 3C:
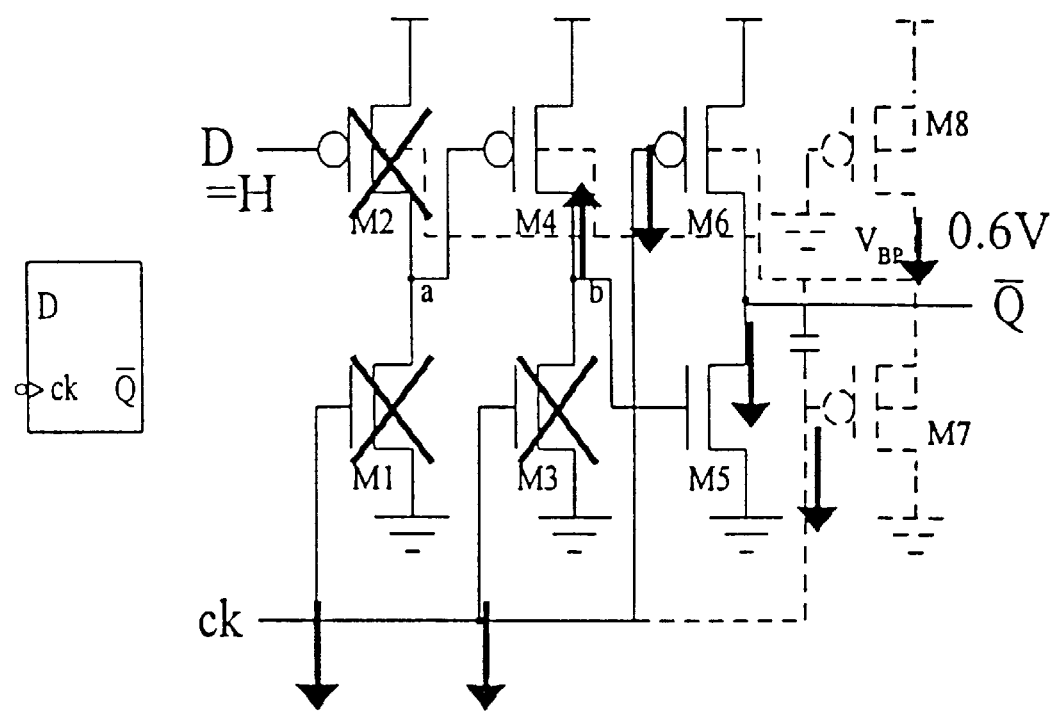
Figure 3D:
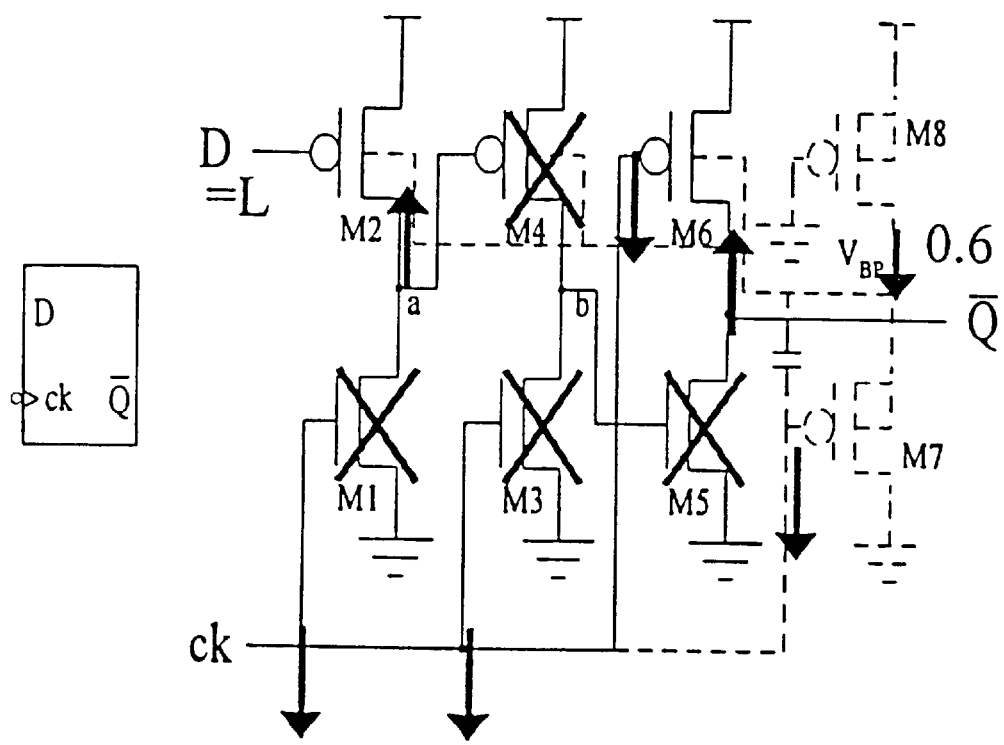

Further, we can replace the P-C²MOS stage in the 7-transistors DFF by another pseudo-nMOS inverter. This becomes a new low-voltage dynamic DFF as shown in FIG. 3(a), and this DFF can be suitable for low-voltage application. The operation principles of this DFF can be briefly described below:

a.) As shown in FIG. 3(b), when "ck" is high, the circuit is in the "hold" mode. The signal, "ck", will turn off M6, and M3 turns on to discharge node "b" to low (i.e., below $V_{tn}$ of M5) in order to turn off M5. Since both M5 and M6 are cut-off now, the data at node $\overline{Q}$ can be held. By the way, M1 must be also turned on to predischarge node "a" to low regardless of the input D.

b.) As shown in FIG. 3(c), When "ck" goes low, the DFF enters into the "evaluation" mode. If the input D is high (i.e., above $V_{dd-}|V_{tp}|$) in this instant, both of M1 and M2 are turned off and node "a" will remain low. Since M3 also turns off now, M4 can pull up node "b" to $V_{dd}$ easily and then node $\overline{Q}$ is discharged to low through M5.

c.) As shown in FIG. 3(d), if D is low (i.e., below $V_{dd-}|V_{tp}|$) as "ck" goes low, M2 will pull up node "a"

quickly to turn off M4. Since M3 is also cut-off now, node "b" can remain low to keep M5 off.

Therefore, node $\overline{Q}$ can be charged to $V_{dd}$ through M6 now.

Figure 3E:
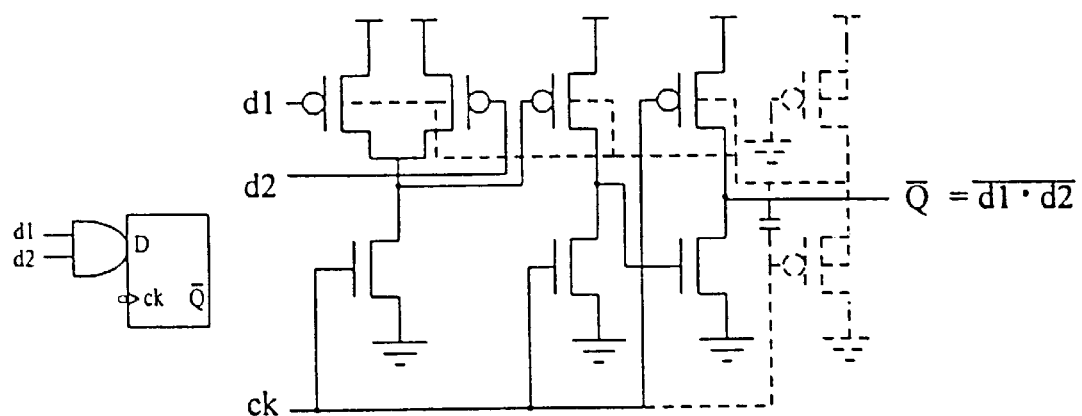

However, in order to make the ratioed flip-flop to operate correctly as stated above, careful design must be done to promise that the NMOS transistors have sufficiently larger pull-down capability than the pull-up capability of the PMOS transistors. Besides, the high level of "ck" must be larger than $V_{dd-}|V_{tp}|$ and the low level must be smaller then $V_{tf}$. The DFF presented here has the same functions as conventional TSPC DFFs but it is faster, especially when operating at low supply voltage. This is because it consists of only 6 transistors and no stacked structures, which suffer from body effect, are used. Besides, if there are some logic gates required in front of the DFFs in circuit designs, we can also include the gates into the flip-flops to form a logic flip-flop (LFF). FIG. 3(e) is an example of such a LFF, which combines an AND gate and a DFF.

Finally, the substrate bias scheme stated in the last section can also be applied on the DFF as the dash lines shown in FIG. 3. Now, the $V_{Sb}$ of the PMOS transistors is dynamically controlled by "ck". In the "hold" mode, i.e., "ck" is high, "ck" turns off M7 and then the body bias of PMOS transistors, $V_{BP}$, is pulled up to $V_{dd}$. This makes the threshold voltages of the PMOS transistors return to the normal value. There are two reasons for it: (1) If the data stored in $\overline{Q}$ is 0 now, the node $\overline{Q}$ is probably pulled up toward $V_{dd}$ by the large leakage current of M6. Biasing the body of the PMOS transistors at $V_{dd}$ can eliminate the large leakage current, and the minimum operating frequency of the circuit can be decreased. (2) Because M4 is always turn-on in this mode, and M2 may also be turned on by the node "D" if "D" is low. The drain currents of M2 and M4 can be reduced by increasing their threshold voltages. Therefore, the pulling down ability of M1 and M2 will not be influenced, and the power dissipation is also reduced.

When the DFF is in its "evaluation" mode, i.e. "ck" is low, both of M7 and M8 turn on. The body of the PMOS transistors is biased at about 0.6 V in order to reduce the effective threshold voltage of the PMOS transistors. This is because either of M2 and M4 must pull up its drain from low to high rapidly in this instant, and M6 may also have to charge the node $\overline{Q}$ from low to high if D is low now. Therefore, by decreasing the effective threshold voltage of the PMOS transistors, the time needed for PMOS transistors to pull up their output nodes can be shorten, and the operating frequency of the circuit can increase.

All of the three PMOS transistors in the DFF (M2, M4 and M6) are in the same N-type well and only one bias circuit (M7 and M8) is used to control their back-gate forward bias voltage. In theory, putting the PMOS transistors in separate N-type wells and controlling their bias voltage separately by three bias circuits using more complicated mechanism is better in speed and power dissipation. But in fact, using too many bias circuits will increase the parasitic capacitance at each node and then degrade the efficiency of the dynamic BGFB method, even worse than no BGFB is used.

B) Synchronous divide-by-4/5 counter

Figure 4:
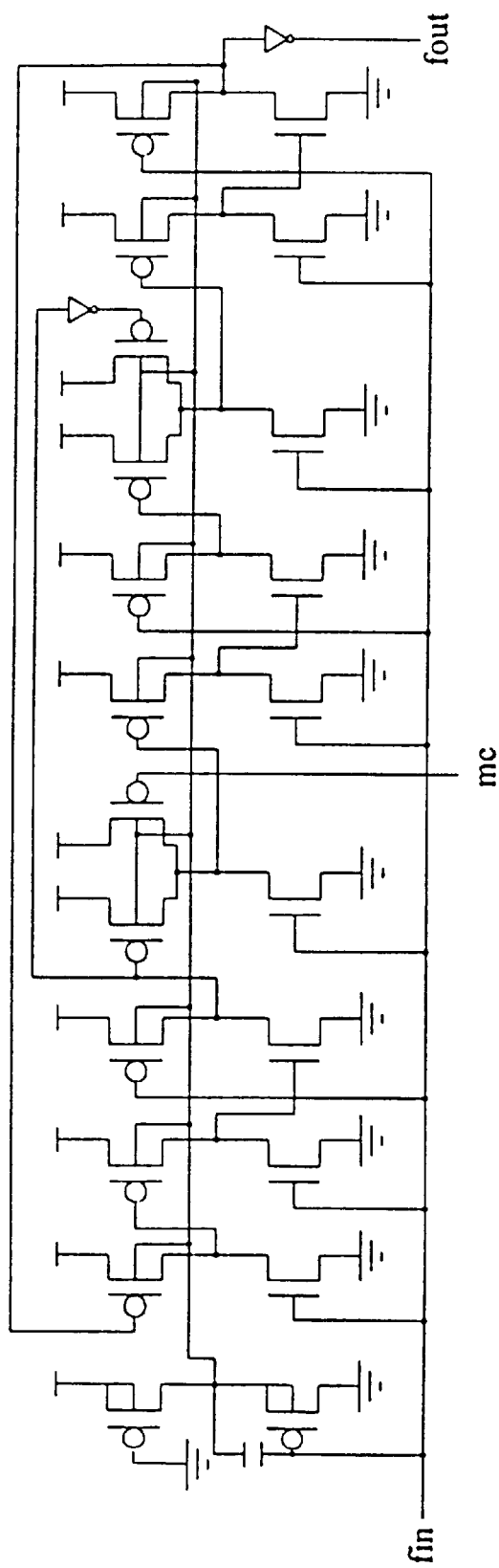
FIG. 4 Low-voltage divide-by-4/5 prescaler using the dynamic BGFB method.

A 1 V dual-modulus divide-by-4/5 prescaler using the proposed DFFs and LFFs is shown in FIG. 4. All of the PMOS transistors are in the same N-type well and only one bias circuit is used to control the bias voltage of the N-type well. The well is biased at 1 V when "ck" is 1 and at 0.6 V when "ck" is 0.

Simulation results show that maximum operating frequency of the prescaler without the BGFB method is about 2 times of the conventional one using TSPC DFFs and static AND gates at 1 V supply voltage. If the substrate bias scheme is applied to the PMOS transistors, the speed can even be improved to 3 times of the TSPC circuits. The other features of the prescaler are also summarized in Table I.

C) Asynchronous divide-by-16 counter

As shown in FIG. 2, the asynchronous counter consists of four TFFs. Since the maximum operating frequency of it is only one-fourth that of the divide-by-4/5 prescaler, conventional TSPC DFFs can be used here for power consumption and stability considerations.

D) Preamplifier

Figure 5A:
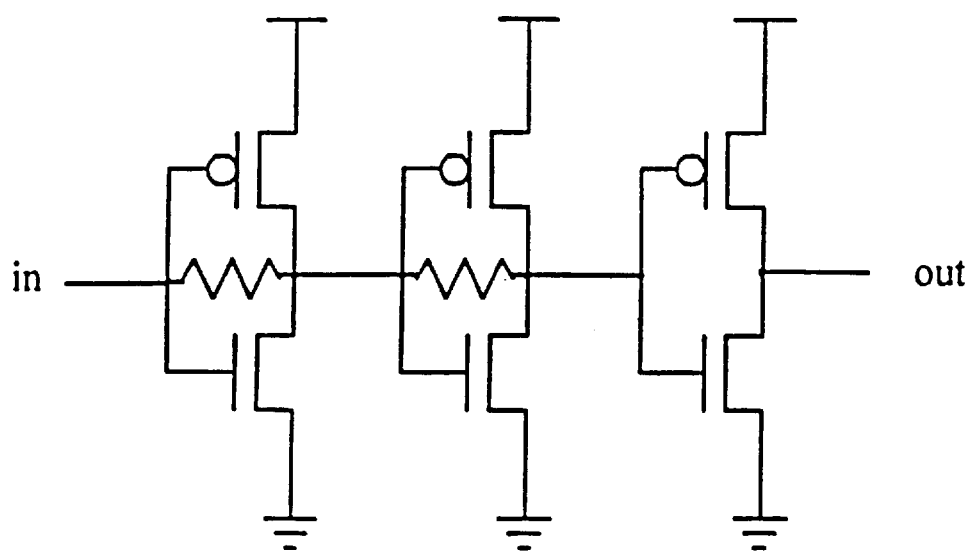
FIG. 5 (a) Conventional preamplifier.
Figure 5B:
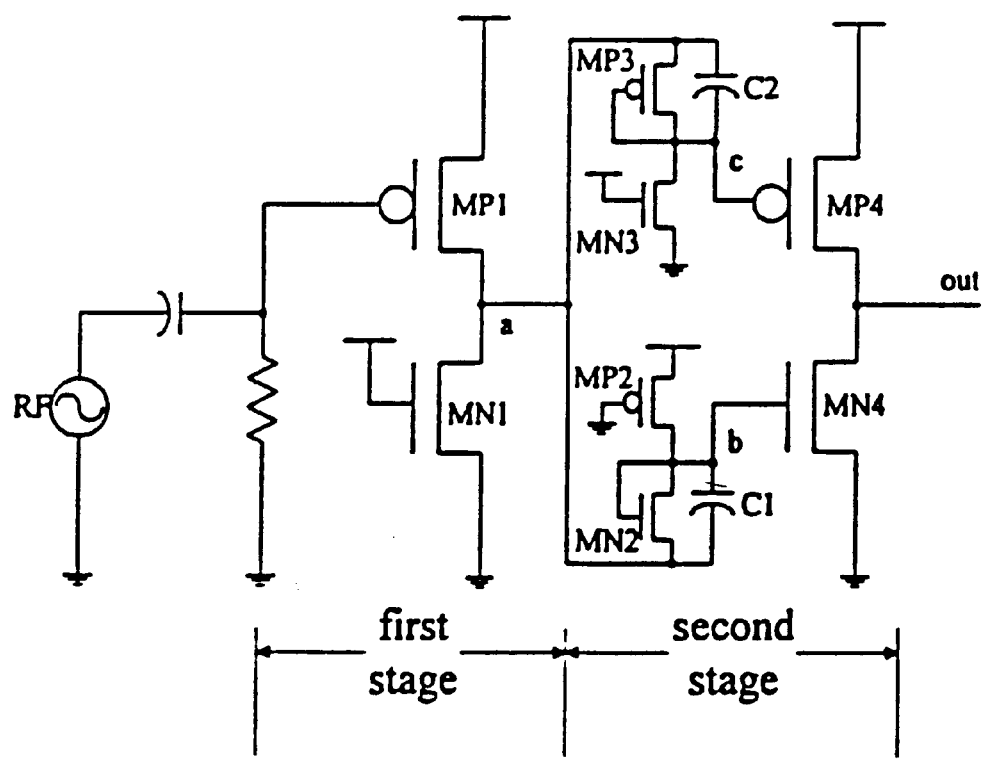

TSPC type dynamic digital circuits require an almost full swing clock signal. However, most of the VCOs used in high frequency communication systems can't provide such a large output signal, so a low-voltage preamplifier is required to amplify the smaller VCO output signal. A conventional preamplifier is shown in FIG. 5(a). It consists of two shunt-shunt feedback amplifiers and an inverter, which is used as a driver. However, the circuit is not able to work at a low supply voltage, such as 1 V. It is because the threshold voltages of the two transistors in the shunt-shunt feedback amplifiers are such large that the dc operating point can't be established properly. In order to solve the problem stated above, a new low-voltage preamplifier is presented, as shown in FIG. 5(b).

The amplifier is composed of two stages. The first stage is a PMOS common-source amplifier with a NMOS transistor as its load. The dc voltage of the gate of MP1 is biased at ground through an off-chip 50-ohm resistor. Then the RF signal is coupled to the amplifier through an off-chip capacitance. The second stage is a low-voltage inverter stage. When node "a" is low (high), MP3 (MN2) is cut-off and node "c" ("b") is pulled down (up) to ground ($V_{dd}$) through MN3 (MP2). Thus, MP4 (MN4) turns on to pull up (down) the output node to high (low). At this time, node "b" ("c") is biased at only a little above (below) $V_{tn}$ ($V_{dd\_}|V_{tp}|$) by MN2 and MP2 (MN3 and MP3). This allows MN4 (MP4) to flow only a small current to prevent it from completely cut-off. It speeds the switching time because when node "a" starts to go high (low) again, the small boost capacitance, C1 (C2), can push node "b" ("c") from $V_{tn}$ ('$V_{dd\_}|V_{tp}|$') to $V_{dd}$ (ground) quickly, instead of from ground ($V_{dd}$) to $V_{dd}$ (ground) in a conventional inverter. Thus, MN4 (MP4) turns on to pull down (up) the output node to low (high) more quickly than a conventional inverter.

Figure 6A:
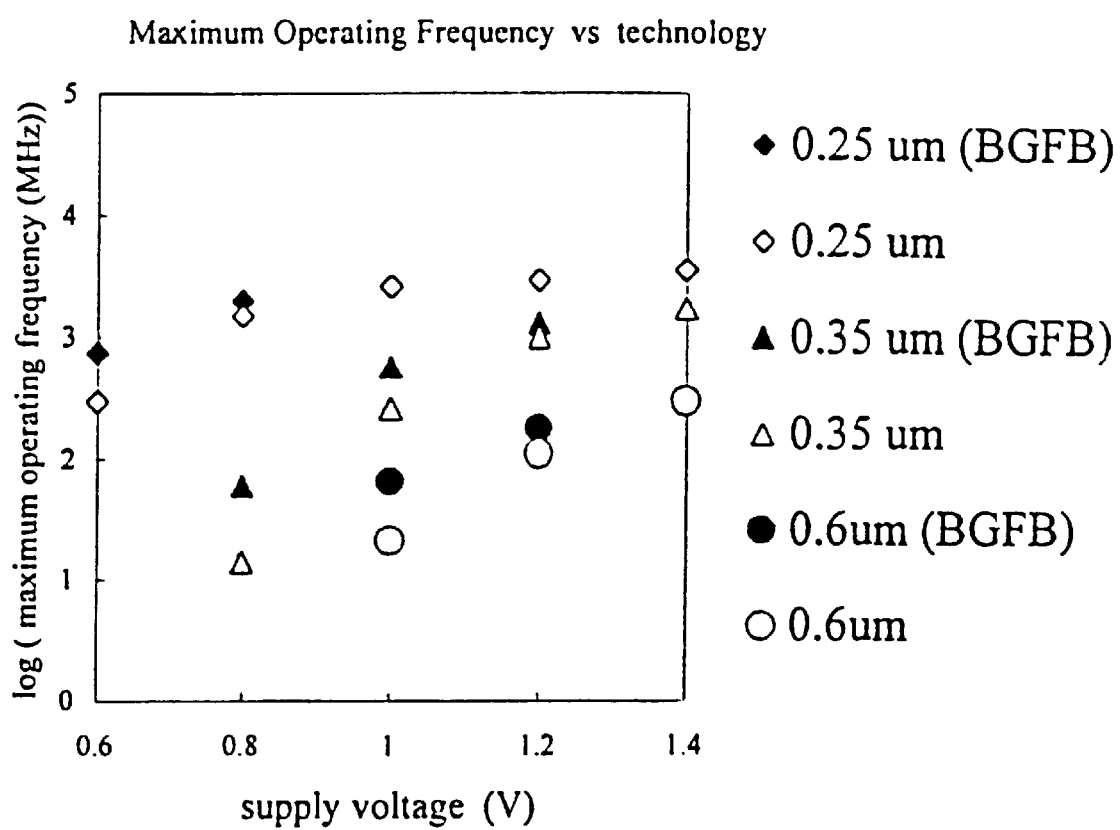
FIG. 6 (a) Simulation results of the maximum operating frequencies of the circuit at different supply voltages between different processes.
Figure 6B:
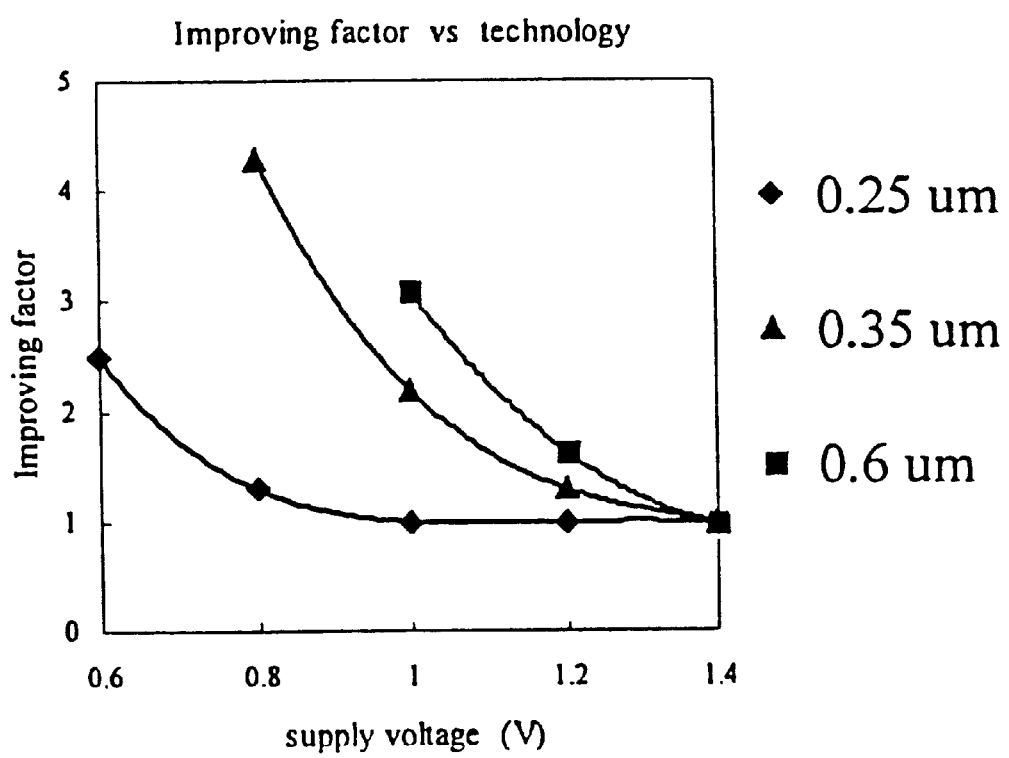

Although the proposed prescaler is only implemented in a 0.35 μm process, the performance of the prescaler between different processes is also compared by simulation. The maximum operating frequencies of the circuit at different supply voltages when BGFB is not used, i.e. the $V_{Sb}$ of the PMOS transistors is always 0, and when BGFB is used, i.e. the $V_{Sb}$ of the PMOS transistors is always 0.4, are simulated by Hspice separately, as shown in FIG. 6 (a). FIG. 6 (b) shows the Improving Factor which can be used as a figure of merit to evaluate the efficiency of the BGFB method. The Improving Factor is defined as the ratio of the available maximum operating frequency of the circuit with BGFB to that without BGFB. By observing the trend of the Improving Factor, the following conclusions can be made:

(1) In the same process, the lower the operating voltage is, the higher the efficiency of the BGFB method is.

(2) At the same supply voltage, the more advanced the process is, the lower the efficiency of the BGFB method is.

(3) The goal of low power dissipation can be achieved by using more advanced processes. For example, comparing the simulation results between the 0.25 μm and the 0.35 μm processes, the maximum operation frequency at the supply voltage of 1 V in the 0.35 μm process is available at the supply voltage of 0.6 V in the 0.25 μm process, and about 40% of the power dissipation can be reduced.

Figure 7:
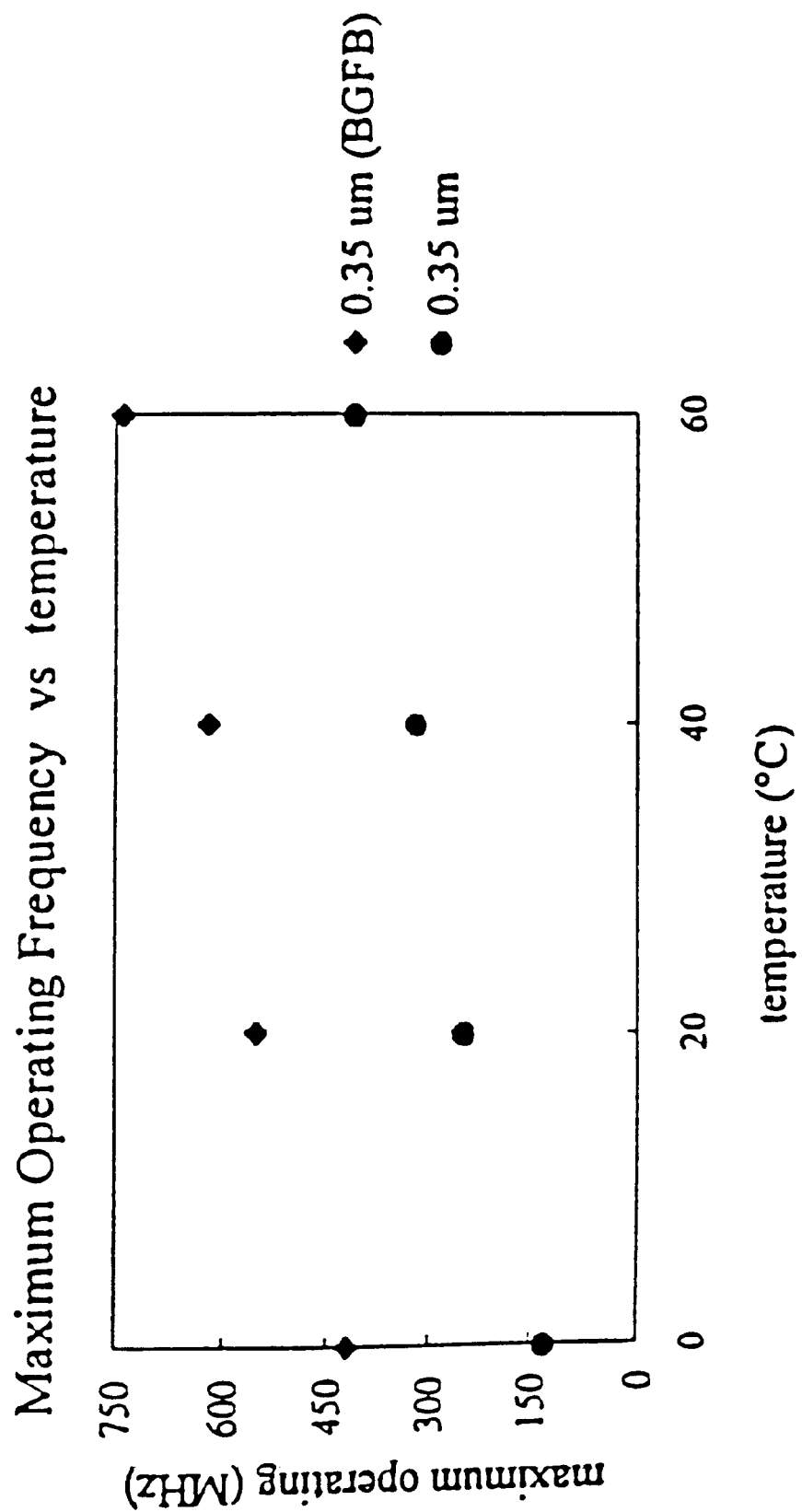
FIG. 7 Simulation results of the maximum operating frequency of the circuit at different temperature.

Besides, the performance of the prescaler at different temperatures is also compared by simulation. The maximum operating frequencies of the circuit using the 0.35 μm process at the supply voltage of 1 V with/without back-gate forward bias are shown in FIG. 7.

Experimental results

Figure 8:
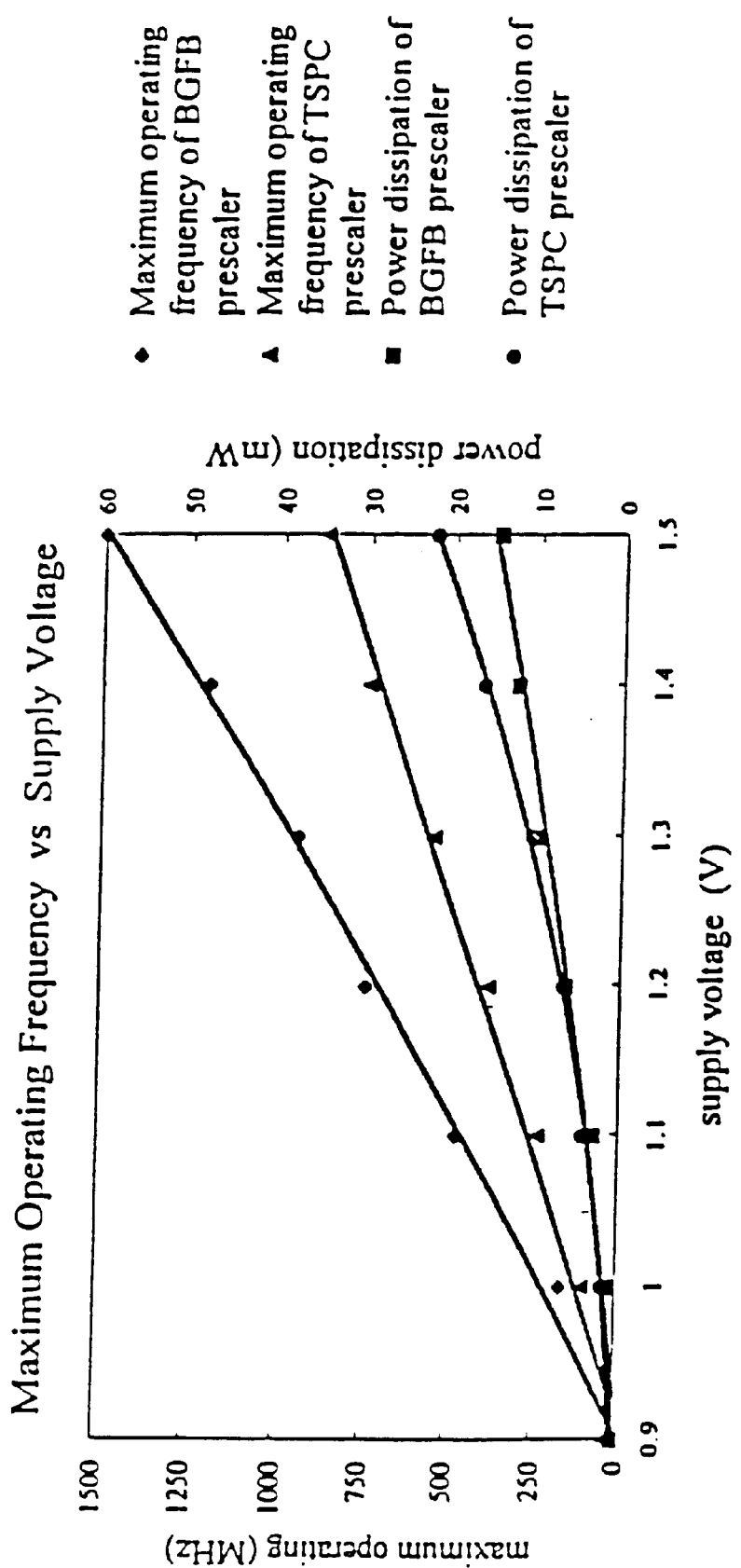
FIG. 8 Measured maximum operating frequency and power dissipation at different supply voltage of the prescalers.
Figure 9:
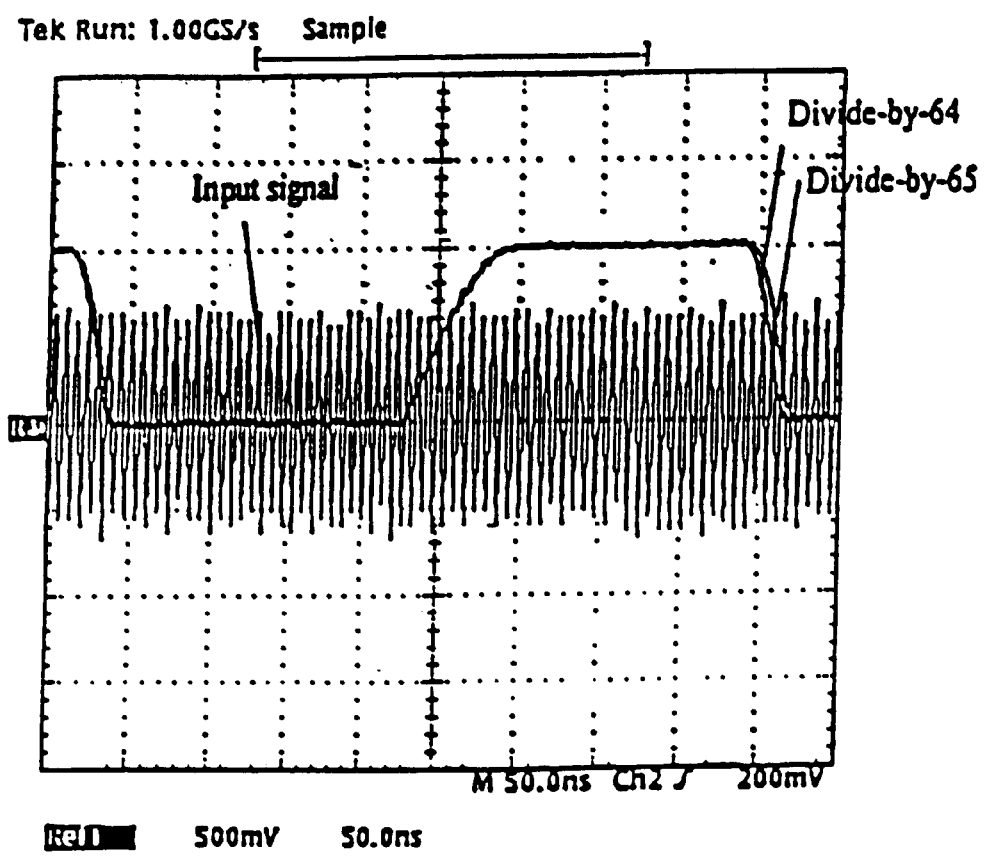
FIG. 9 Measured input and output waveforms of the prescaler.
Figure 10:
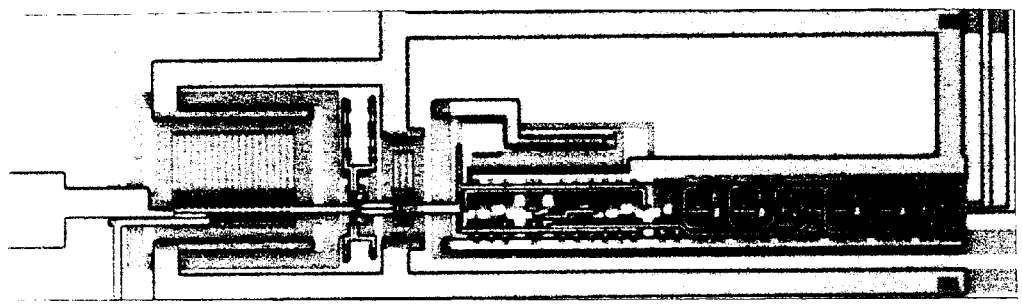
FIG. 10 . Photograph of the prescaler

The low-voltage prescaler and preamplifier chip has been measured at supply voltage from 0.9 V to 1.5 V. FIG. 8 shows the measured maximum operating frequency and power dissipation at different supply voltage. When the supply voltage is 1.5 V, the prescaler can operate at a clock rate of about 1.5 GHz. The maximum operating frequency of 170 MHz and the power dissipation of 0.9mW (90% of the power is dissipated in the preamplifier, and 10% of it is dissipated in the prescaler) have been measured at 1 V supply voltage. Besides, a divide-by-64 prescaler consisting of six cascaded TSPC TFFs is also implemented for comparison. Experimental results show that the maximum operating frequency of the proposed prescaler is higher than that of the TSPC one. Also, the power dissipation of the proposed circuit is less than that of the TSPC one. FIG. 9 shows the 170 MHz input waveform and the output waveforms in the two different modes. FIG. 10 shows the die photograph of the chip.

Conclusion

In this invention, a new DFF using the dynamic BGFB method is presented. The DFF consists of only 6 transistors and it is very suitable in low-voltage operation. The DFF can also include a logic gate in it to form a LFF and further reduce the gate delay. A 1 V dual-modulus divide-by-64/65 prescaler with the proposed DFFs and LFFs has been fabricated with the 0.35 μm standard CMOS process. The maximum operating frequency of 170 MHz with the power consumption of 0.9 mW (including a preamplifier) has been measured at 1 V supply voltage.

TABLE 1

|  | transistor count | clocked transistor** | power dissipation |
|---|---|---|---|
| TSPC* | 41 | 12 | 18.1 μW @ 100 MHz |
| Proposed | 24 and a capacitor | 10 and a capacitor | 18.7 μW @ 100 MHz |

*The prescaler using TSPC DFFs and static AND gates
**The number of the transistors connected to the clock signal

What is claimed is:

1. A low-voltage dynamic back-gate forward bias prescaler circuit for operating at one volt, said prescaler circuit comprising;

a prescaler including
a first stage having a synchronous divide-by-4/5 frequency divider;
a second stage connect to said first stage and having an asynchronous divide-by-16 frequency divider having, no more than four stages;
control circuits connected to said second stage and for determining a divide-ratio of said first stage; and
a preamplifier positioned in front of said prescaler and connected to said prescaler for amplifying small input signals and completing the circuit.

2. The low-voltage dynamic back-gate forward bias prescaler circuit as claimed in claim 1, wherein said first stage further includes a low-voltage dynamic BGFB D flip-flop and two low-voltage dynamic BGFB Logic flip-flops.

3. The low-voltage dynamic back-gate forward bias prescaler circuit as claimed in claim 2, wherein said flip-flops comprise six transistors for parasitic capacitance in the circuit, and each said flip-flop is of low-voltage design and negative-edge triggered.

4. The low-voltage dynamic back-gate forward bias prescaler circuit as claimed in claim 2, wherein said first stage further includes a logic gate in each of the low-voltage dynamic BGFB flip-flops for reducing gate delay.

5. The low-voltage dynamic back-gate forward bias prescaler circuit as claimed in claim 2, wherein said each of the low-voltage dynamic EGFB flip-flops further includes a p-channel with a N-type well; and said prescaler circuit further including a bias circuit for adjusting a bias voltage of the N-type wells dynamically, and for embracing a driving capability of each said p-channel without increasing leakage current.

* * * * *